(12) United States Patent
Won et al.

(10) Patent No.: US 7,232,492 B2
(45) Date of Patent: Jun. 19, 2007

(54) METHOD OF FORMING THIN FILM FOR IMPROVED PRODUCTIVITY

(75) Inventors: Seok-Jun Won, Seoul (KR); Weon-Hong Kim, Suwon-si (KR); Dae-Jin Kwon, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 26 days.

(21) Appl. No.: 11/007,884

(22) Filed: Dec. 9, 2004

(65) Prior Publication Data

US 2005/0130427 A1 Jun. 16, 2005

(30) Foreign Application Priority Data

Dec. 11, 2003 (KR) .................... 10-2003-0090400

(51) Int. Cl.
*B08B 3/12* (2006.01)
*B08B 6/00* (2006.01)
*B08B 7/00* (2006.01)

(52) U.S. Cl. .................... 134/1; 134/1.1; 134/1.2; 134/1.3

(58) Field of Classification Search .................... None
See application file for complete search history.

(56) References Cited

U.S. PATENT DOCUMENTS 6,001,742 A * 12/1999 Chang .................... 438/706
6,277,194 B1 8/2001 Thilderkvist et al. .......... 117/94
6,589,868 B2 7/2003 Rossman .................... 438/680
6,776,851 B1 * 8/2004 Singh et al. .................... 134/26
2002/0086118 A1 7/2002 Chang et al. ................ 427/447
2002/0117472 A1 * 8/2002 Sun et al. .................... 216/68
2004/0009678 A1 * 1/2004 Asai et al. .................... 438/785
2004/0011380 A1 * 1/2004 Ji et al. ........................ 134/1.1
2004/0013818 A1 * 1/2004 Moon et al. ................ 427/576
2004/0084709 A1 * 5/2004 Kim et al. .................... 257/306

FOREIGN PATENT DOCUMENTS

JP 03-100743 4/2003
KR 01-51165 6/2001

* cited by examiner

*Primary Examiner*—Duy-Vu N. Deo
(74) *Attorney, Agent, or Firm*—Mills & Onello, LLP

(57) ABSTRACT

There is provided a method of forming a thin film for providing improved fabrication productivity. The method includes introducing a semiconductor substrate into a process chamber. A process thin film is formed on the semiconductor substrate, in which a chamber coating layer is formed on inner walls of the process chamber while the process thin film is formed. The semiconductor substrate is removed from the process chamber. A stress relief layer is formed on the chamber coating layer. After all of the above operations are repeatedly performed at least one time, an in-situ cleaning is performed on the chamber coating layer and the stress relief layer, which are alternately formed in stack on the inner walls of the process chamber.

24 Claims, 4 Drawing Sheets

METHOD OF FORMING THIN FILM FOR IMPROVED PRODUCTIVITY

CROSS-REFERENCE TO RELATED APPLICATION

This application claims the benefit of Korean Patent Application No. 2003-90400, filed Dec. 11, 2003, the contents of which are hereby incorporated herein by reference in their entirety.

BACKGROUND

1. Technical Field

The present invention relates to a method of fabricating semiconductor devices and, more particularly, to a method of forming a thin film for providing improved fabrication productivity.

2. Discussion of the Related Art

The fabrication of semiconductor devices involves many processes for forming various kinds of thin films. For example, a dielectric layer such as a silicon oxide layer ($SiO_2$), a silicon nitride layer (SiN), a hafnium oxide layer ($HfO_2$), an aluminum oxide layer ($Al_2O_3$), and the like is used for a gate oxide layer, an insulating spacer, an etch stop layer, a capacitor dielectric layer, and the like. Further, a conductive layer such as a polysilicon layer, a tungsten layer, an aluminum layer, or the like is formed for use in a gate electrode, interconnections, or the like. A chemical vapor deposition (CVD) method is widely used for forming the thin film, but the thin film formation process has recently focused on study of an atomic layer deposition (ALD) method. The ALD method forms thin films in the unit of an atomic layer, along with alternating chemisorption and surface reaction of reactant materials, and desorption of by-products, and it has many advantages such as an excellent step coverage and the like.

One of the problems associated with the thin film formation process is that an undesired thin film may be formed on the inner walls of a process chamber where the thin film formation process is being performed to form a process thin film on a semiconductor substrate. The thin film formed on the inner walls of the process chamber is peeled off from the inner walls of the process chamber as the thin films increase thickness, and the peeled films serve as particles which affect the thin film fabrication process, and provide one cause for reduction in production yield of semiconductor devices. Therefore, the thin film formation process also needs to include a cleaning process to remove periodically the undesired thin film deposited on the inner walls of the process chamber in order to prevent the above problem. In the conventional technology, a wet cleaning process is often employed to remove the deposited thin film from the inner walls of the process chamber by disassembling the process chamber and exposing it to an appropriate chemical solution. However, this wet cleaning process requires much down time, thereby causing a large loss in the production yield. Further, since the inside of the process chamber is exposed to the atmosphere, it may be contaminated by impurities in the atmosphere.

As one method of solving the above disadvantage of the wet cleaning processes, an in-situ cleaning may be employed, in which an etch gas is supplied into the process chamber without exposing the inside of the process chamber to the atmosphere, and the thin film deposited on the inner walls of the process chamber can be removed in situ state.

FIG. 1 is a flow chart illustrating a conventional method of forming thin films. Referring to FIG. 1, a semiconductor substrate is introduced into a process chamber (step 100). A process thin film is formed on the semiconductor substrate (step 102). During formation of the process thin film, a thin film is also formed on the inner walls of the process chamber. The semiconductor substrate is removed from the process chamber (step 104). Then, an in-situ cleaning is performed (step 106). The in-situ cleaning is carried out by supplying an etch gas into the process chamber, and etching the thin film deposited on the inner walls of the process chamber to remove it. In the conventional method, a plurality of semiconductor substrates can be sequentially treated inside the process chamber before performing the in-situ cleaning, while the number of the treated semiconductor substrates depends on the kinds and the thickness of the process thin films.

For high fabrication productivity, it is preferable to process a larger number of semiconductor substrates before performing the in-situ cleaning. However, if the number of semiconductor substrates that are treated before the in-situ cleaning is small, a process period of the in-situ cleaning is short, which is not preferable from the standpoint of productivity improvement. Further, in the conventional method as described above, if the thickness of the thin films formed on the inner walls of the process chamber is increased, since the thin film serves as particle source, there is a limit to the amount by which the period of the in-situ cleaning can be increased. Therefore, in order to improve the productivity of the thin film formation process, it is necessary to increase the period of the in-situ cleaning, and preferably, it is also necessary to shorten the process time required for the in-situ cleaning. In specific, the thin film formation process by the ALD method has characteristics in that a growth rate of the thin film is very low because of the formation of the thin film in the unit of atomic layer. Thus, a method of overcoming the above problem is further required in order to improve the productivity.

Furthermore, a method of forming an improved seasoning film on the inner walls of a process chamber to increase the cleaning period in the thin film formation process is disclosed in U.S. Pat. No. 6,589,868.

SUMMARY OF THE INVENTION

The present invention is directed to a method of forming a thin film, capable of continuously treating a number of semiconductor substrates and increasing a cleaning period of a process chamber by suppressing particles stripped from the inner walls of the process chamber. Further, the present invention is directed a method of forming a thin film, for increasing fabrication productivity of semiconductor devices by shortening a process time for cleaning the process chamber.

Exemplary embodiments of the present invention provide a method of forming a thin film. The method includes introducing a semiconductor substrate into a process chamber. A process thin film is formed on the semiconductor substrate, in which a chamber coating layer is formed on inner walls of the process chamber while the process thin film is formed. The semiconductor substrate is removed from the process chamber. Then, a stress relief layer is formed on the chamber coating layer.

Further, in accordance with an exemplary embodiment, the steps of introducing the semiconductor substrate, forming the process thin film on the semiconductor substrate, removing the semiconductor substrate from the process chamber, and forming the stress relief layer on the chamber coating layer may be sequentially repeated.

In accordance with exemplary embodiments of the present invention, a method of forming a thin film may include performing an in-situ cleaning of a chamber coating layer and a stress relief layer, which are alternately formed in a stack on the inner walls of the process chamber, after introducing a semiconductor substrate into a process chamber; forming a process thin film on the semiconductor substrate, removing the semiconductor substrate from the process chamber; forming a stress relief layer on the chamber coating layer formed on the inner walls of the process chamber; and repeatedly performing the above operations.

The in-situ cleaning may be performed by a dry etch using a plasma. The dry etch using a plasma may use an etch gas selected from the group consisting of $BCl_3$, $Cl_2$, $ClF_3$, $CHF_3$, $CF_4$, $O_2$, Ar and He, and a mixture thereof. Other etch gases may also be used. The chamber coating layer may be a hafnium oxide layer.

In accordance with exemplary embodiments of the present invention, the process thin film and the chamber coating layer may be dielectric layers such as an aluminum oxide layer ($Al_2O_3$) or a hafnium oxide layer ($HfO_2$), which may be formed using an ALD method.

In an exemplary embodiment of the present invention, the stress relief layer may be formed of a material layer having an etch rate higher than that of the chamber coating layer. In one embodiment, the stress relief layer may be formed with a thickness of 1 Å~100 Å. In one embodiment, if the chamber coating layer is a hafnium oxide layer, the stress relief layer is a carbon rich hafnium oxide layer. Alternatively, if the chamber coating layer is a hafnium oxide layer, the stress relief layer is a tantalum oxide layer. The hafnium oxide layer and the tantalum oxide layer may be formed using an ALD method. In one embodiment, the stress relief layer may be formed of an amorphous layer having an etch rate higher than that of the chamber coating layer.

In another exemplary embodiment of the present invention, the stress relief layer may be a nitrified surface layer, which is formed by plasma-treating the surface of the chamber coating layer in the presence of an atmosphere gas containing nitrogen. In one embodiment, the atmosphere gas containing nitrogen comprises at least on of $N_2$, $N_2O_2$, and $N_2O$.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
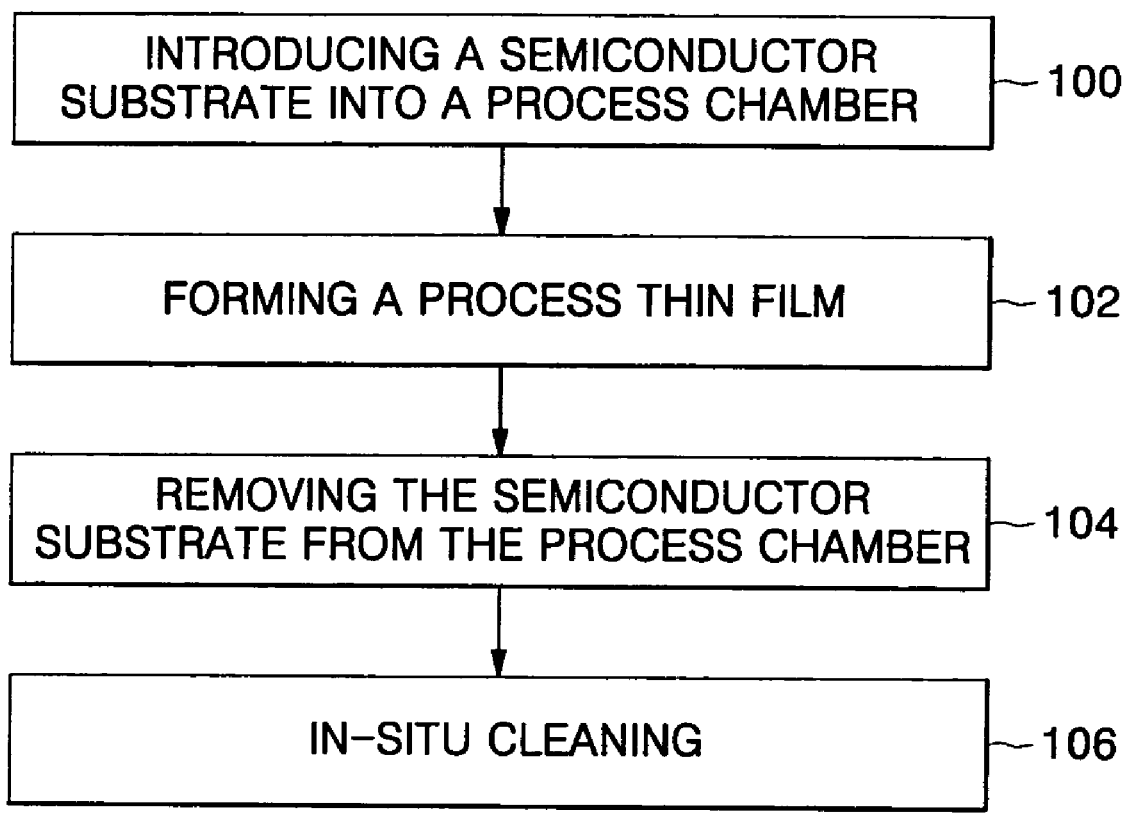
FIG. 1 is a flow chart illustrating a conventional method of forming thin films.
Figure 2:
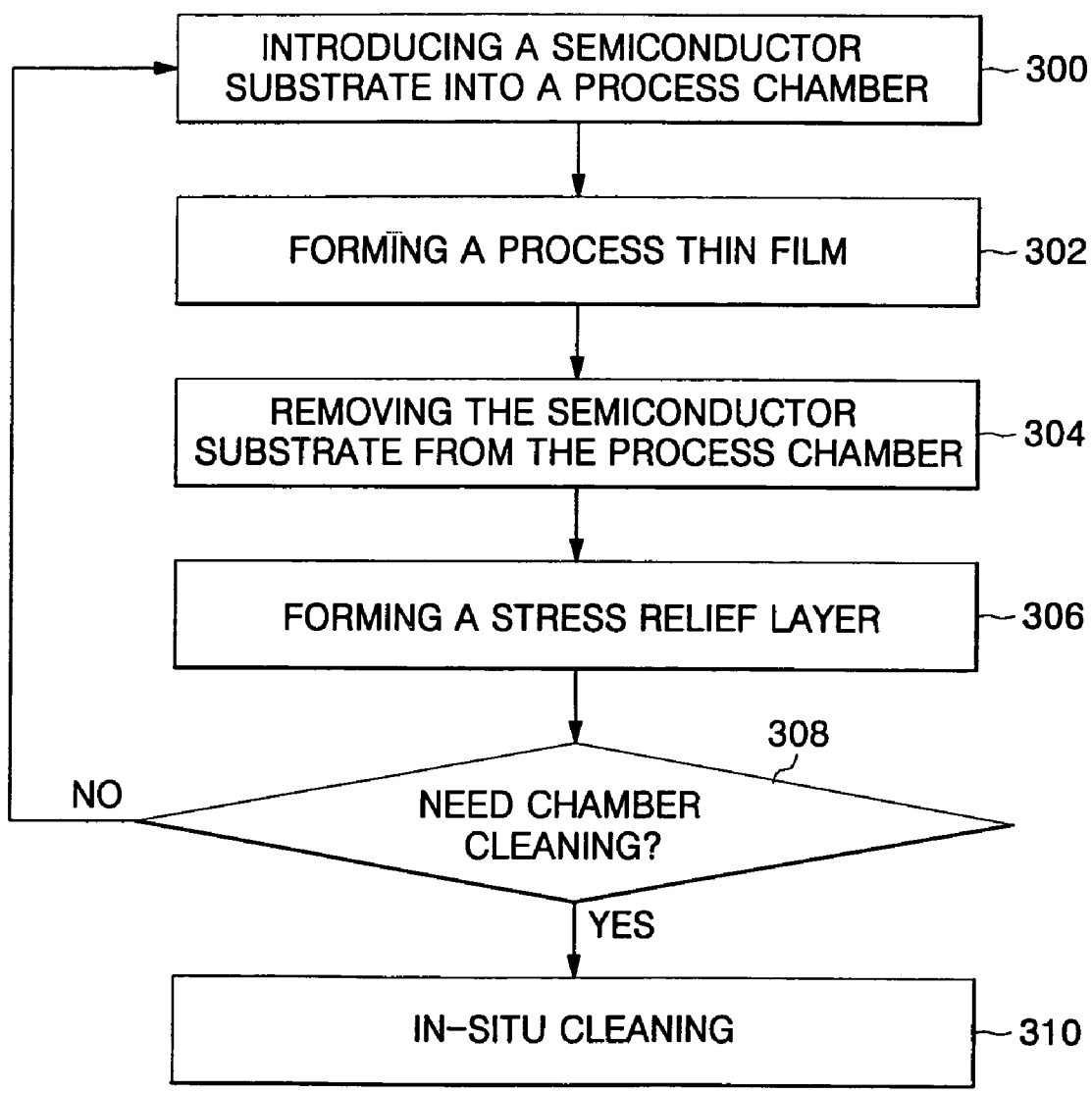
FIG. 2 is a flow chart illustrating a method of forming thin films according to embodiments of the present invention.

FIG. 2 is a flow chart illustrating a method of forming thin films according to embodiments of the present invention. Referring to FIG. 2, a semiconductor substrate is introduced into a process chamber (step 300). Then, a process thin film is formed on the semiconductor substrate (step 302). While the process thin film is formed on the semiconductor substrate, a chamber coating layer is formed on the inner walls of the process chamber. The chamber coating layer is the same film as the process thin film. In the embodiments of the present invention, the process thin film and the chamber coating layer may be hafnium oxide layers formed by an ALD method. Then, the semiconductor substrate on which the process thin film is formed is removed from the process chamber (step 304). Then, in the state that the semiconductor substrate is removed from the process chamber, a stress relief layer is formed on the chamber coating layer (step 306).

The stress relief layer according to one embodiment of the present invention may be formed of a material layer having an etch rate higher than that of the chamber coating layer. More preferably, the stress relief layer may be formed of an amorphous layer having an etch rate higher than that of the chamber coating layer. In one embodiment of the present invention, the stress relief layer may be formed of a carbon rich hafnium oxide layer by an ALD method, or may be formed of a tantalum oxide layer ($Ta_2O_5$) by an ALD method. The stress relief layer is preferably formed with a thickness of 1~100 Å, and more preferably, formed with a thickness of 1~10 Å.

According to another embodiment of the present invention, the stress relief layer, which is formed on the chamber coating layer, may be a nitrified surface layer. That is, the stress relief layer may be formed by plasma-treating the surface of the chamber coating layer in the presence of nitrogen-containing atmosphere gas. In specific, nitrogen-containing atmosphere gas is introduced into the process chamber after removing the semiconductor substrate from the process chamber. The atmosphere gas may be, for example, $N_2$, $N_2O_2$, or $N_2O$. Then, the chamber coating layer formed on the inner walls of the process chamber is plasma-treated, so as to form a thin nitrified layer on the top portion of the chamber coating layer. The time for plasma treatment is preferably within 30 seconds. In another embodiment of the present invention, if the chamber coating layer is a hafnium oxide layer, the nitrified surface layer may be, for example, an amorphous hafnium oxinitride layer.

After the stress relief layer is formed, the above steps (step 300, 302, 304, and 306) may be repeatedly performed at least two times before an in-situ cleaning is carried out (step 310). As a result, the chamber coating layer and the stress relief layer are alternately stacked on the inner walls of the process chamber. The number of iterations of the above processes (step 300, 302, 304, and 306) may be determined in consideration of the requirements of the in-situ cleaning (step 308).

In the embodiments of the present invention, the stress relief layer is formed in order to suppress peeling of the chamber coating layer off the inner walls of the process chamber, and the peeled portion of the chamber coating layer serves as particles during subsequent processes of forming thin films.

With a thickness of the thin film increased, a stress of the thin film is generally increased. The stress may be a compressive stress or a tensile stress depending on the difference of thermal expansion coefficients of the thin film and an under-layer on which the thin film is formed, for example, the semiconductor substrate or the inner walls of the process chamber. If the thickness of the thin film is increased, and the stress of the thin film reaches its critical value, the thin film is locally stripped off from the under-layer. Further, the stress increase of the thin film in accordance with the thickness increase of the thin film is related with a change of layer structure in accordance with the thickness of the thin film. That is, the thin film, which has been grown as an amorphous layer during the initial state where the thin film was formed, is grown as a crystalline layer because an atom mobility on the surface of the thin film is increased due to the heat energy stored on the thin film during the film formation process, or other reasons, when the thickness of the thin film is increased. If the thin film is grown crystallized, a surface roughness of the thin film is increased, and a stress of the thin film is also increased. As a result, the stripping of the thin film proceeds more rapidly.

For the same reasons as described above, the chamber coating layer, which is formed on the inner walls of the process chamber, is also peeled off when its thickness is increased, and furthermore, if the chamber coating layer is grown as a crystallized layer when its thickness exceeds a critical value, the chamber coating layer may be peeled off more rapidly. Therefore, in order to prevent the peeling of the chamber coating layer, it is necessary to suppress the peeling due to the stress increase when the chamber coating layer is formed in thick, and more preferably, it is necessary to suppress that the chamber coating layer is grown crystallized.

According to the embodiments of the present invention, the above processes (step 300, 302, 304 and 306) are repeatedly carried out so that stress relief layers with a thin thickness are formed on the inner walls of the process chamber alternately along with the chamber coating layer. The stress relief layer interposed between the chamber coating layers functions to prevent the chamber coating layers from growing in thick as identical material layers and from being peeled off when the stress of the layers is increased. Further, since the stress relief layer is formed of an amorphous layer, it functions to prevent the crystallization of the chamber coating layer. As a result, the generation of particles can be suppressed due to the peeling of the chamber coating layer formed on the inner walls of the process chamber, and thus, a greater number of semiconductor substrates can be treated before the in-situ cleaning is performed. That is, as the period of the in-situ cleaning is increased, fabrication productivity of the thin film formation process can be improved.

Still referring to FIG. 2, after the above processes (step 300, 302, 304, and 306) are repeatedly performed and a greater number of semiconductor substrates are treated, the in-situ cleaning is performed (step 310). The in-situ cleaning may be a dry etch using a plasma. The dry etch using a plasma may use an etch gas selected from the group consisting of $BCl_3$, $Cl_2$, $ClF_3$, $CHF_3$, $CF_4$, $O_2$, Ar and He, and a mixture thereof, but it is not confined thereto. In the embodiments of the present invention, if the chamber coating layer is a hafnium oxide layer, the in-situ cleaning may be performed by introducing $Cl_2$, $BCl_3$, and Ar as an etch gas into the process chamber.

As described above, since the layer structure of the thin film becomes more compact, when the chamber coating layer is grown crystallized, an etch rate is decreased during the in-situ cleaning. However, according to the embodiment of the present invention, the stress relief layer is formed between the chamber coating layers so as to prevent the crystallization of the chamber coating layer and increase the etch rate of the in-situ cleaning.

Figure 3A:
FIGS. 3A and 3B are SEM images comparatively illustrating thin films formed by a conventional method, and an embodiment of the present invention respectively.
Figure 3B:

FIGS. 3A and 3B are SEM images comparatively illustrating thin films formed by a conventional method, and an embodiment of the present invention, respectively. FIG. 3A shows a hafnium oxide layer 12 formed on a semiconductor substrate 10 by a conventional method, and FIG. 3B shows a stacked layer 22 of a hafnium oxide layer and a tantalum oxide layer formed on a semiconductor substrate 20 according to one embodiment of the present invention. The results of FIGS. 3A and 3B were achieved by directly forming the hafnium oxide layer and the stacked layer on the semiconductor substrate, respectively for experiments. However, a chamber coating layer formed on the inner walls of the process chamber may show the same results as those of FIGS. 3A and 3B in actual processes.

The hafnium oxide layer 12 of FIG. 3A was formed with a thickness of about 573 Å using an ALD method. In FIG. 3B, a hafnium oxide layer and a tantalum oxide layer as a stress relief layer were staked (referred to as a stacked layer 22) according to one embodiment of the present invention. The hafnium oxide layer and the tantalum oxide layer were alternately formed in a stack using an ALD method. The hafnium oxide layer was formed with a thickness of 70 Å, and the tantalum oxide layer was formed with a thickness of 25 Å, and so, the stacked layer 22 was finally formed with a thickness of 570 Å. In an actual process as shown in FIG. 2, the tantalum oxide layer is formed on the hafnium oxide layer formed on the inner walls of the process chamber after the semiconductor substrate having the hafnium oxide layer formed thereon is removed from the process chamber. In FIGS. 3A and 3B, the hafnium oxide layers were formed in the process chamber, which is maintained at a temperature of 300° C. and with a pressure of 3 Torr. Further, TEMAH (tetra ethyl methyl amino hafnium) was used as a hafnium source, and $O_2$ as an oxide gas was introduced into the process chamber at a flow rate of 100 sccm. Meanwhile, the tantalum oxide layer was formed using PET (penta ethoxy tantalum) as a tantalum source. Process conditions such as a process temperature, a pressure, and types of oxide gas are employed in the same way as the formation process of the hafnium oxide layers.

Referring to FIGS. 3A and 3B, the hafnium oxide layer 12 formed by a conventional method shows a very rough surface morphology as shown in FIG. 3A. This result shows that the hafnium oxide layer 12 has been grown and crystallized. If the hafnium oxide layer 12 is crystallized, it receives a higher compression stress and is peeled off from the semiconductor substrate 10 more easily. In the case that a hafnium oxide layer with a thickness of 70 Å and a tantalum oxide layer with a thickness of 25 Å are alternately formed, the result shows a smooth surface as shown in FIG. 3b, which illustrates that the hafnium oxide layer maintains amorphous phase. That is, if a chamber coating layer and a stress relief layer are alternately formed on the inner walls of the process chamber in an actual process as one embodiment of the present invention, it can prevent the stress increase due to the thickness increase of the chamber coating layer and the crystallization thereof, and the particle generation due to the peeling of the chamber coating layer. Further, a number of semiconductor substrates can be treated without a possibility of the particle generation due to the peeling of the chamber coating layer so that a period of the in-situ cleaning is increased, and productivity of the semiconductor device fabrication process can be significantly improved.

Figure 4A:
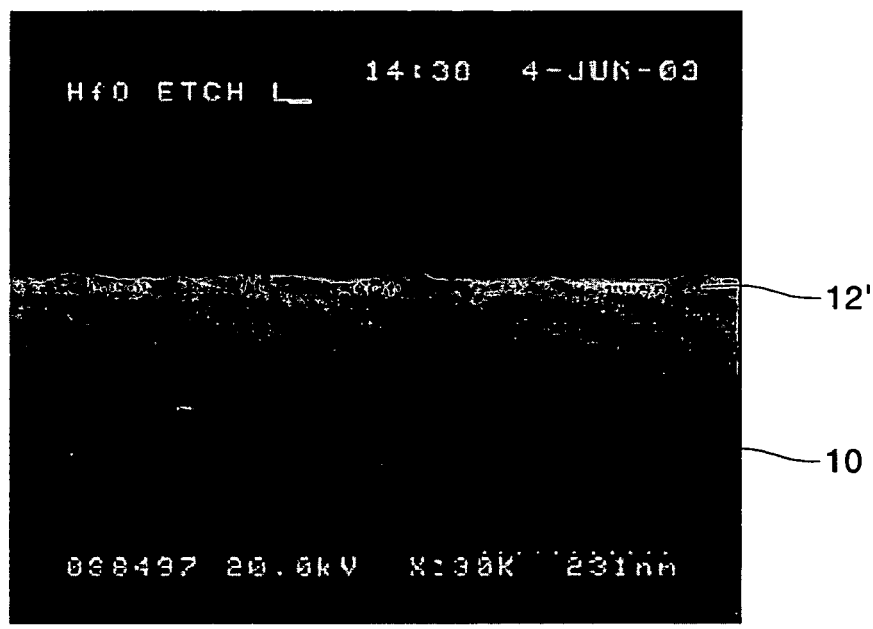
FIGS. 4A and 4B are SEM images comparatively illustrating results after in-situ cleaning the thin films illustrated in FIG. 3A and FIG. 3B, respectively.
Figure 4B:
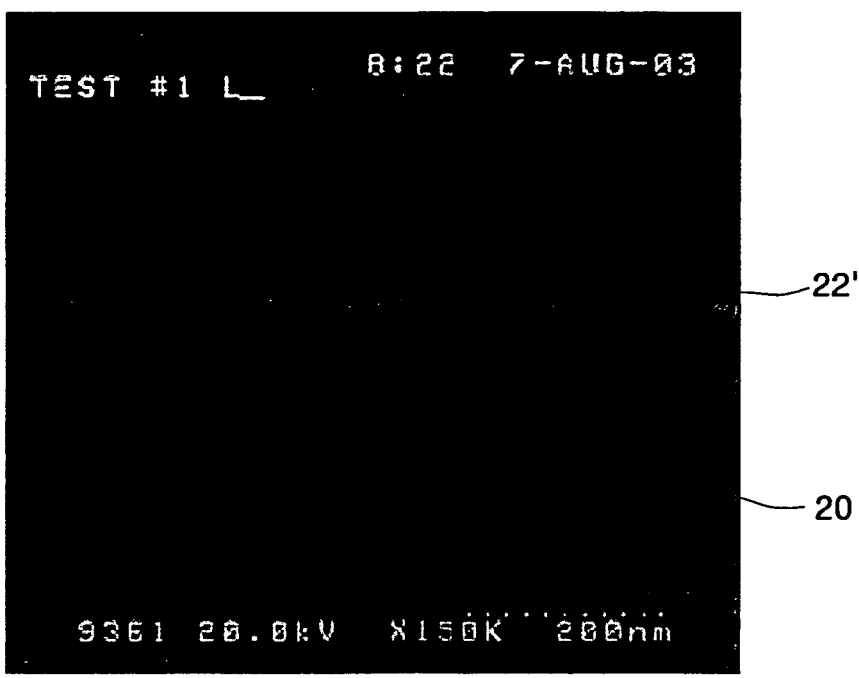

FIGS. 4A and 4B are SEM images comparatively illustrating results after in-situ cleaning the thin films illustrated in FIG. 3A and FIG. 3B, respectively.

In FIGS. 4A and 4B, the in-situ cleaning was performed with respect to the resultant layers of FIGS. 3A and 3B, respectively. The in-situ cleaning was performed while the process chamber is maintained with a pressure of about 8 mTorr, and a plasma source power and a bias power are 900 W and 160 W, respectively. Further, $Cl_2$, $BCl_3$ and Ar were introduced into the process chamber with flow rates of 70 sccm, 30 sccm, and 60 sccm, respectively. Referring to FIGS. 4A and 4B, the in-situ cleaning was performed for 40 seconds on the hafnium oxide layer 12 of FIG. 3A. As a result, the hafnium oxide layer 12 was etched by about 362 Å in thickness, and the thickness of the hafnium oxide layer 12' remaining on the semiconductor substrate 10 was about 211 Å. The in-situ cleaning was performed for 25 seconds on the stacked layer 22 of FIG. 3B. As a result, the stacked layer was etched by about 500 Å, and the thickness of the stacked layer 22' remaining on the semiconductor substrate 20 was about 70 Å.

While an etch rate in the conventional method, which is achieved with respect to the hafnium oxide layer 12, is about 543 Å/min, an etch rate achieved from the embodiment of the present invention is about 859 Å/min, which is increased by about 1.6 times. These results shows that the crystallization of the hafnium oxide layer is suppressed owing to the tantalum oxide layer formed as a stress relief layer according to the embodiments of the present invention. That is, as described above according to the embodiments of the present invention, the chamber coating layer with particle-free stacked layered-structure can be formed thick in thickness on the inner walls of the process chamber, so that a period of the in-situ cleaning can be increased, and an etch rate of the chamber coating layer during the in-situ cleaning can be increased. Therefore, a productivity of the thin film formation process can be improved.

According to the present invention as described above, a stress relief layer is formed on the thin film, which is formed on the inner walls of the process chamber, after the semiconductor substrate is removed from the process chamber, in order to suppress the particles stripped from the thin film formed on the inner walls of the process chamber. As a result, a number of semiconductor substrates can be continuously treated before the process chamber is cleaned, thereby increasing a cleaning period of the process chamber.

Further, the crystallization of the thin film formed on the inner walls of the process chamber can be suppressed, so as to shorten a process time consumed for a cleaning process of the process chamber, and thus, improve a productivity of the thin film formation process.

What is claimed is:

1. A method of forming a thin film comprising:
   a) introducing a semiconductor substrate into a process chamber;
   b) forming a process thin film on the semiconductor substrate, in which a chamber coating layer is formed on inner walls of the process chamber while the process thin film is formed, wherein the process thin film and the chamber coating layer are dielectric layers;
   c) removing the semiconductor substrate from the process chamber; and
   d) after removing the semiconductor substrate from the process chamber, forming a stress relief layer on the chamber coating layer on the inner walls of the process chamber.

2. The method according to claim 1, wherein the stress relief layer is formed of a material layer having an etch rate being higher than that of the chamber coating layer.

3. The method according to claim 1, wherein the stress relief layer is formed of an amorphous layer having an etch rate higher than that of the chamber coating layer.

4. The method according to claim 3, wherein the stress relief layer is formed with a thickness of 1 Å~100 Å.

5. The method according to claim 3, wherein if the chamber coating layer is a hafnium oxide layer, the stress relief layer is a carbon rich hafnium oxide layer.

6. The method according to claim 3, wherein if the chamber coating layer is a hafnium oxide layer, the stress relief layer is a tantalum oxide layer.

7. The method according to claim 6, wherein the hafnium oxide layer and the tantalum oxide layer are formed using an ALD method.

8. The method according to claim 1, wherein the stress relief layer is a nitrified surface layer.

9. The method according to claim 8, wherein forming the nitrified surface layer comprises plasma-treating the surface of the chamber coating layer for nitrification in the presence of an atmosphere gas containing nitrogen.

10. The method according to claim 9, wherein the atmosphere gas containing nitrogen comprises at least one of $N_2$, $N_2O_2$, and $N_2O$.

11. The method according to claim 8, wherein the process thin film and the chamber coating layer are hafnium oxide layers formed using an ALD method.

12. A method of forming a thin film comprising:
   a) introducing a semiconductor substrate into a process chamber;
   b) forming a process thin film on the semiconductor substrate, in which a chamber coating layer is formed on inner walls of the process chamber while the process thin film is formed, wherein the process thin film and the chamber coating layer are dielectric layers;
   c) removing the semiconductor substrate from the process chamber;
   d) after removing the semiconductor substrate from the process chamber, forming a stress relief layer on the chamber coating layer on the inner walls of the process chamber; and
   e) repeatedly performing the steps a) to d) at least one time.

13. The method according to claim 12, wherein the stress relief layer is formed of a material layer having an etch rate higher than that of the chamber coating layer.

14. The method according to claim 12, wherein the stress relief layer is formed of an amorphous layer having an etch rate higher than that of the chamber coating layer.

15. The method according to claim 14, wherein the process thin film and the chamber coating layer are hafnium oxide layers, and the stress relief layer is a tantalum oxide layer.

16. The method according to claim 12, wherein the stress relief layer is a nitrified surface layer.

17. The method according to claim 16, wherein forming the nitrified surface layer comprises plasma-treating the surface of the chamber coating layer for nitrification in the presence of an atmosphere gas containing nitrogen.

18. A method of forming a thin film comprising:
   a) introducing a first semiconductor substrate into a process chamber;
   b) forming a first process thin film on the first semiconductor substrate, in which a first chamber coating layer is formed on inner walls of the process chamber while the first process thin film is formed;

c) removing the first semiconductor substrate from the process chamber;

d) after removing the first semiconductor substrate from the process chamber, forming a first stress relief layer on the chamber coating layer on the inner walls of the process chamber;

e) introducing a second semiconductor substrate into the process chamber;

f) forming a second process thin film on the second semiconductor substrate, in which a second chamber coating layer is formed on the first stress relief layer of the process chamber while the second process thin film is formed;

g) removing the second semiconductor substrate from the process chamber; and h) after removing the second semiconductor substrate from the process chamber, removing the first chamber coating layer, the first stress relief layer, and the second chamber coating layer that are alternatively formed in a stack on the inner walls of the process chamber by in-situ cleaning.

19. The method according to claim 18, wherein the in-situ cleaning is performed by a dry etch using a plasma.

20. The method according to claim 19, wherein the dry etch using a plasma uses a gas selected from the group consisting of $BCl_3$, $Cl_2$, $ClF_3$, $CHF_3$, $CF_4$, $O_2$, Ar and He, and a mixture thereof.

21. The method according to claim 18, wherein at least one of the first and second chamber coating layers is a hafnium oxide layer.

22. The method according to claim 18 further comprising forming a second stress relief layer on the second chamber coating layer, wherein the second stress relief layer is removed from the process chamber by in-situ cleaning.

23. A method of forming a thin film comprising:

a) introducing a semiconductor substrate into a process chamber;

b) forming a process thin film on the semiconductor substrate, in which a chamber coating layer is formed on inner walls of the process chamber while the process thin film is formed, c) removing the semiconductor substrate from the process chamber;

d) after removing the semiconductor substrate from the process chamber, forming a stress relief layer on the chamber coating layer on the inner walls of the process chamber, wherein the stress relief layer is formed of an amorphous layer having an etch rate higher than that of the chamber coating layer, and wherein the process thin film and the chamber coating layer are hafnium oxide layers, and the stress relief layer is a tantalum oxide layer; and e) repeatedly performing the steps a) to d) at least one time.

24. A method of forming a thin film comprising:

a) introducing a semiconductor substrate into a process chamber;

b) forming a process thin film on the semiconductor substrate, in which a chamber coating layer is formed on inner walls of the process chamber while the process thin film is formed, wherein the process thin film and the chamber coating layer are dielectric layers;

c) removing the semiconductor substrate from the process chamber; and d) forming a stress relief layer on the chamber coating layer, wherein the stress relief layer is formed of an amorphous layer having an etch rate higher than that of the chamber coatinglayer, wherein if the chamber coating layer is a hafnium oxide layer, the stress relief layer is a carbon rich hafnium oxide layer.

* * * * *